United States Patent [19]
Takekoshi

[11] Patent Number: 6,024,629
[45] Date of Patent: Feb. 15, 2000

[54] PROBE APPARATUS AND A METHOD FOR POLISHING A PROBE

[75] Inventor: Kiyoshi Takekoshi, Yamanashi-ken, Japan

[73] Assignee: Tokyo Electron Limited, Tokyo, Japan

[21] Appl. No.: 09/010,116

[22] Filed: Jan. 21, 1998

[30] Foreign Application Priority Data

Jan. 22, 1997 [JP] Japan .................................. 9-023133

[51] Int. Cl.[7] ...................................................... B24B 1/04
[52] U.S. Cl. ................ 451/28; 451/67; 451/162
[58] Field of Search ........................ 451/28, 5, 41, 451/162, 166, 164, 2; 324/158

[56] References Cited

U.S. PATENT DOCUMENTS

| 4,590,422 | 5/1986 | Milligan . |
| 5,642,432 | 6/1997 | Mori ........................................ 382/145 |

FOREIGN PATENT DOCUMENTS

| 56-12744 | 2/1981 | Japan . |
| 61-4969 | 1/1986 | Japan . |

OTHER PUBLICATIONS

Patent Abstracts of Japan, vol. 014, No. 136 (P–1021), Mar. 14, 1990, JP 02 002939, Jan. 8, 1990.
Patent Abstracts of Japan, vol. 010, No. 352 (E–458), Nov. 27, 1986, JP 61 152034, Jul. 10, 1986.

*Primary Examiner*—Robert A. Rose
*Assistant Examiner*—George Nguyen
*Attorney, Agent, or Firm*—Oblon, Spivak, McClelland, Maier & Neustadt, P.C.

[57] ABSTRACT

A probe apparatus according to the present invention comprises a stage carrying an object of inspection thereon and rotatable and movable in the horizontal and vertical directions, a probe located over the stage and adapted to be brought into contact with the object of inspection on the stage in order to subject the object to electrical inspection, a polisher carrying section attached to the stage and capable of carrying thereon a polisher for polishing the probe, a storage mechanism for storing the polisher, and a transportation mechanism for transporting the polisher between the storage mechanism and the polisher carrying section.

12 Claims, 8 Drawing Sheets

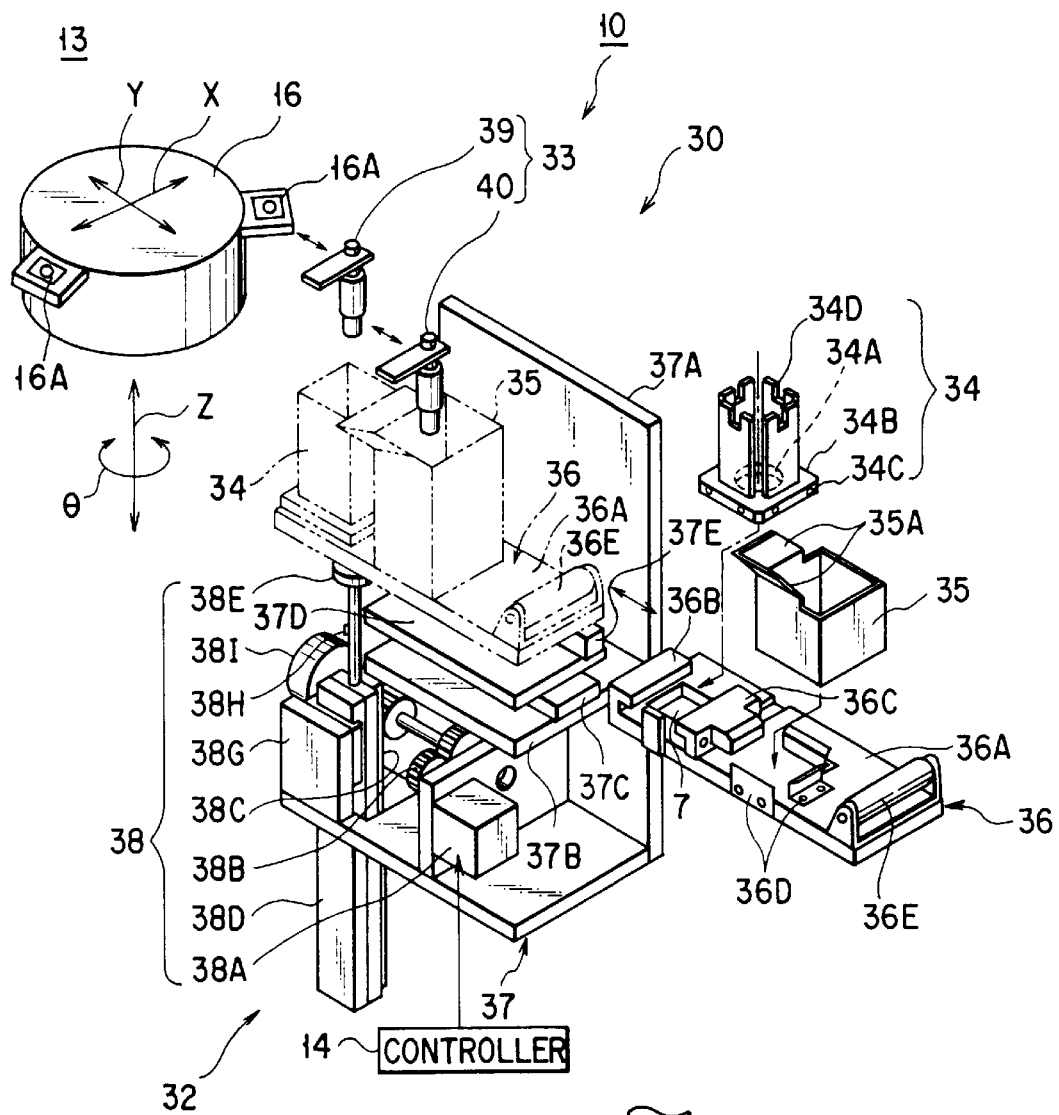
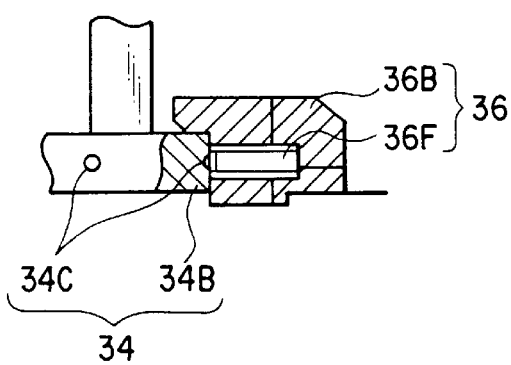
FIG. 4A
FIG. 4B

PROBE APPARATUS AND A METHOD FOR POLISHING A PROBE

BACKGROUND OF THE INVENTION

The present invention relates to a probe apparatus and a method for polishing a probe.

Conventionally, a probe apparatus 10 of the type shown in FIGS. 9 and 10 is used for electrical inspection of IC chips that are formed on a semiconductor wafer (hereinafter referred to simply as "wafer"), for example. As shown in these drawings, this apparatus 10 comprises a cassette carrying section 11 in which a cassette C stored with wafers W is placed, a loader section 12 including a transportation mechanism (not shown) for transporting each wafer W delivered from the cassette C in the section 11, a prober section 13 for inspecting the wafer W transported by means of the transportation mechanism, a controller 14 for controlling the prober section 13 and the loader section 12, and a display unit 15 that doubles as a control panel for operating the controller 14. The loader section 12 is provided with a sub-chuck (not shown), whereby the wafer w is pre-aligned on the basis of its orientation flat. The pre-aligned wafer W is transported to the prober section 13 by the transportation mechanism. The prober section 13 is provided with a main chuck 16 movable in the X-, Y-, and Z-directions and the θ-direction (direction of rotation around the Z-axis) and capable of carrying the wafer W thereon, an alignment mechanism 17 including a CCD camera, an alignment optical system or the like for accurately aligning the wafer W on the main chuck 16 in a position for inspection, and a probe card 18 having a probe 18A for electrically inspecting the wafer W aligned by means of the alignment mechanism 17. A swingable head plate 19 is mounted on the top face of the prober section 13. The probe card 18 is fixed to a center aperture of the head plate 19 by means of an insert ring 19A. A test head 20 is rotatably located on the prober section 13. In electrically inspecting the IC chips on the wafer W, the probe card 18 and a tester (not shown) are connected electrically to each other through the test head 20, and a given inspection signal from the tester is transmitted to the IC chips of the wafer W on the main chuck 16 via the probe card 18.

A card transportation arm (not shown) is provided on the front side of the prober section 13. This transportation arm transports the probe card 18 with a card holder to a position right under the insert ring 19A of the head plate 19. Normally, the card transportation arm is contained in a cover 21 that is attached to the front of the prober section 13. In changing the probe card 18, the card transportation arm is raised to a level position and then turned to the position right under the insert ring 19A with the cover 21 lowered. The transportation arm, thus positioned right under the ring 19A, receives the probe card 18 that is automatically disengaged from the ring 19A, and transports it to the front of the prober section 13. At this time, an operator removes the card 18 on the card transportation arm, and places a new probe card 18 on the transportation arm. Thereafter, the transportation arm, carrying the new card 18 thereon, is turned again to the position right under the insert ring 19A.

In the electrical inspection of the wafer W, the wafer W on the main chuck 16 and the probe 18A are aligned with each other by means of a drive mechanism, such as a moving table that is movable in the X- and Y-directions, for example. Thereafter, the main chuck 16 is overdriven upward, whereupon a natural oxide film (e.g., aluminum oxide film) formed on the surface of an electrode pad (formed of, e.g., aluminum) of the wafer W is scraped off by means of the probe 18A, so that the probe 18A and the electrode pad can be securely brought into electrical contact with each other. If this inspection is repeated, however, oxide aluminum, an electrical insulator, may adhere to the probe 18A, or the distal end of the probe 18A may wear, possibly hindering the inspection thereafter. Conventionally, therefore, a steady inspection is secured by polishing the probe 18A in a manner such that a polishing plate, which is attached to a part of the main chuck 16, is brought into contact with the probe 18A, and that the chuck 16 is moved up and down.

In general, the polishing plate is used semi-permanently without replacing. Accordingly, its repeated use leaves filings thereon, which float as particles, possibly exerting a bad influence on the inspection, as the main chuck 16 moves. Although the filings are removed from the polishing plate by suction, therefore, production of the particles cannot be fully prevented by that alone. The influence of the particles becomes more serious as the IC chips are microminiaturized, in particular. As the polishing plate is repeatedly used, it is gradually worn at its polishing surface and its polishing ability gradually decreases. Naturally, this problem can be solved by changing the polishing plate on each occasion. According to the conventional arrangement, however, the polishing plate can be changed only after evacuating the test head 20 from the probe apparatus 10 and swinging the head plate 19 open to expose the prober section 13. Since the polishing plate is attached to the main chuck 16 by means of screws or the like, moreover, its replacement is very complicated and takes a lot of time.

BRIEF SUMMARY OF THE INVENTION

A first object of the present invention is to provide a probe apparatus, whereby even disposable polishers can be automatically changed with high efficiency in a short period of time, so that high-reliability inspection can be effected.

A second object of the invention is to provide a probe polishing method, whereby a probe of a probe apparatus can be polished with high accuracy depending on its type and subjected to high-accuracy inspection.

The first object of the invention is achieved by the following probe apparatus. This probe apparatus comprises: a stage carrying an object of inspection thereon and rotatable and movable in the horizontal and vertical directions; a probe located over the stage and adapted to be brought into contact with the object of inspection on the stage in order to subject the object to electrical inspection; a polisher carrying section attached to the stage and capable of carrying thereon a polisher for polishing the probe; a storage mechanism for storing the polisher; and a transportation mechanism for transporting the polisher between the storage mechanism and the polisher carrying section.

The second object of the invention is achieved by the following method for polishing a probe. This probe polishing method comprises the steps of: transporting a polisher from a polisher storage section by means of a transportation mechanism so that the polisher is placed on a polisher carrying section on a stage for carrying an object of inspection thereon; moving the stage, thereby bringing the polisher on the polisher carrying section into contact with a probe, located over the stage and adapted to be brought into contact with the object of inspection on the stage in order to subject the object to electrical inspection, and polishing the probe by means of the polisher; and transporting the used polisher on the polisher carrying section to the polisher storage section by means of the transportation mechanism and transporting an unused polisher from the polisher storage section by means of the transportation mechanism so that the unused polisher is placed on the polisher carrying section.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4A is a perspective view of a storage mechanism of the automatic changing apparatus;

FIG. 4B is a sectional view showing a state of connection between a first storage box and a fixing mechanism;

DETAILED DESCRIPTION OF THE INVENTION

An embodiment of the present invention will now be described in detail with reference to the accompanying drawings.

Figure 1:
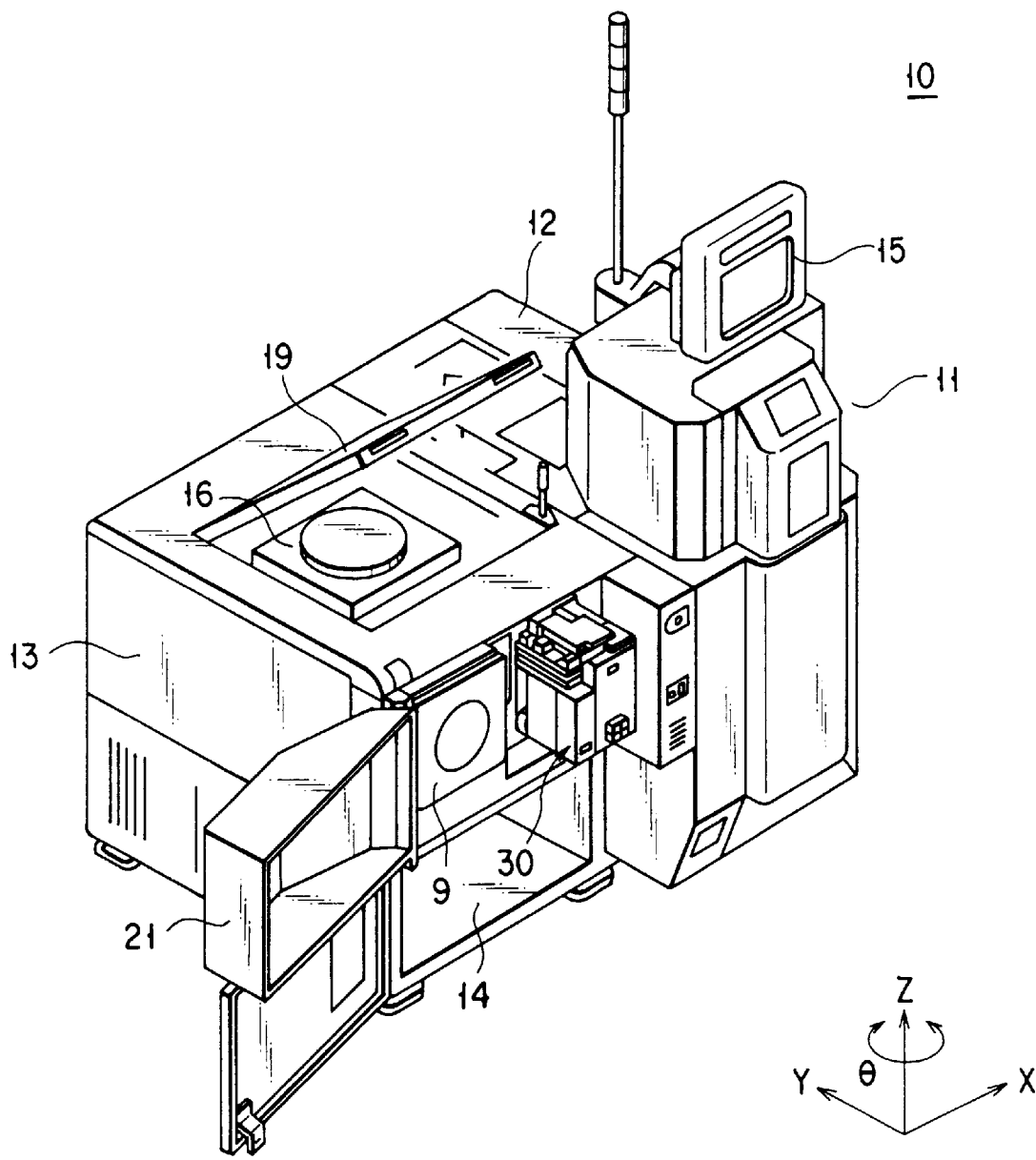
FIG. 1 is a perspective view of a probe apparatus according to an embodiment of the present invention.

As shown in FIG. 1, a probe apparatus 10 according to the present embodiment comprises a cassette carrying section 11 in which a cassette stored with wafers is placed, a loader section 12 including a transportation mechanism (not shown) for transporting each wafer delivered from the cassette in the section 11, a prober section 13 for inspecting the wafer transported by means of the transportation mechanism, a controller 14 for controlling the prober section 13 and the loader section 12, and a display unit 15 that doubles as a control panel for operating the controller 14. The loader section 12 is provided with a sub-chuck (not shown), whereby the wafer is pre-aligned on the basis of its orientation flat or its notch. The pre-aligned wafer is transported to the prober section 13 by the transportation mechanism. The prober section 13 is provided with a main chuck 16 movable in the X-, Y-, and Z-directions and the θ-direction (direction of rotation around the Z-axis) and capable of carrying the wafer thereon, an alignment mechanism (not shown) for accurately aligning the wafer on the main chuck 16 in a position for inspection, and a probe card 18 (see FIG. 8B) having a probe 18A for electrically inspecting the wafer aligned by means of the alignment mechanism. A swingable head plate 19 is mounted on the top face of the prober section 13. The probe card 18 is fixed to a center aperture of the head plate 19 by means of an insert ring. A test head (not shown) is rotatably located on the prober section 13. In electrically inspecting the IC chips on the wafer, the probe card 18 and a tester (not shown) are connected electrically to each other through the test head, and a given inspection signal from the tester is transmitted to the IC chips of the wafer on the main chuck 16 via the probe card 18.

A card transportation arm 9 is provided on the front side of the prober section 13. This transportation arm 9 transports the probe card 18 with a card holder to a position right under the insert ring of the head plate 19. Normally, the arm 9 is contained in a cover 21 that is attached to the front of the prober section 13. In changing the probe card 18, the arm 9 is raised to a horizontal position and then turned to the position right under the insert ring with the cover 21 swung open. The transportation arm 9, thus positioned right under the insert ring, receives the probe card 18 that is automatically disengaged from the insert ring, and transports it to the front of the prober section 13. At this time, an operator removes the card 18 on the card transportation arm 9, and places a new probe card 18 on the arm 9. Thereafter, the arm 9, carrying the new card 18 thereon, is turned again to the position right under the insert ring.

To set the polishing plate 31 in alignment, the main chuck 16 is moved in X- and Y-direction, and the corners of the plate 31 are detected by the alignment mechanism. The center of the polishing plate 31 and the inclination thereof are calculated from the corners of the plate 31 thus detected.

Figure 2:
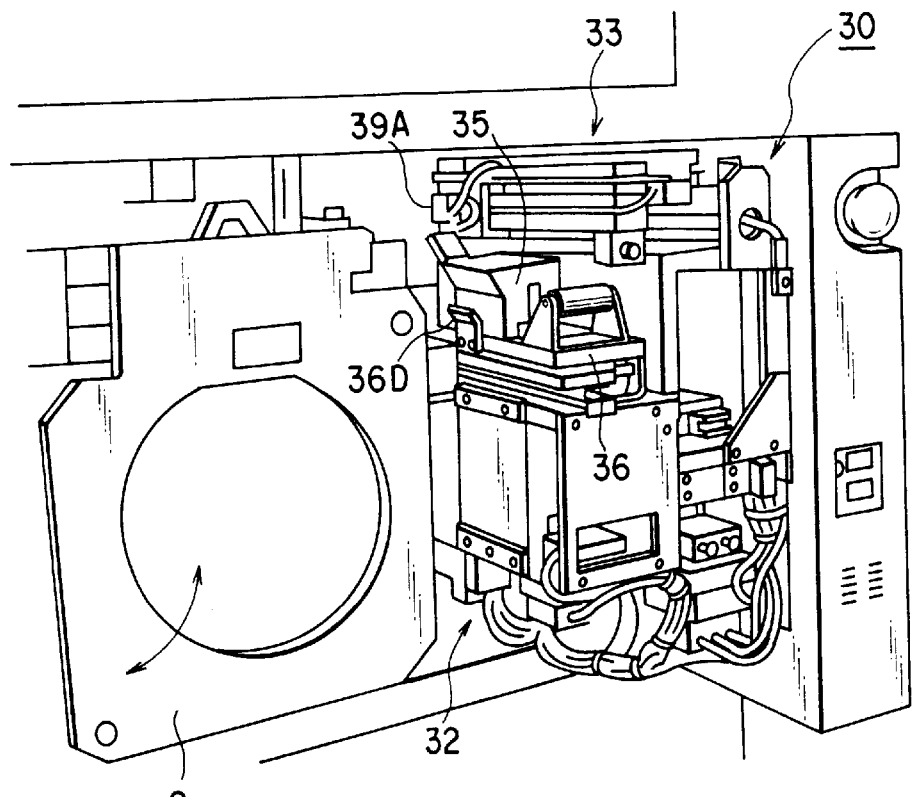
FIG. 2 is a perspective view of an automatic changing apparatus partially exposed to the outside of the probe apparatus of FIG. 1.
Figure 3:
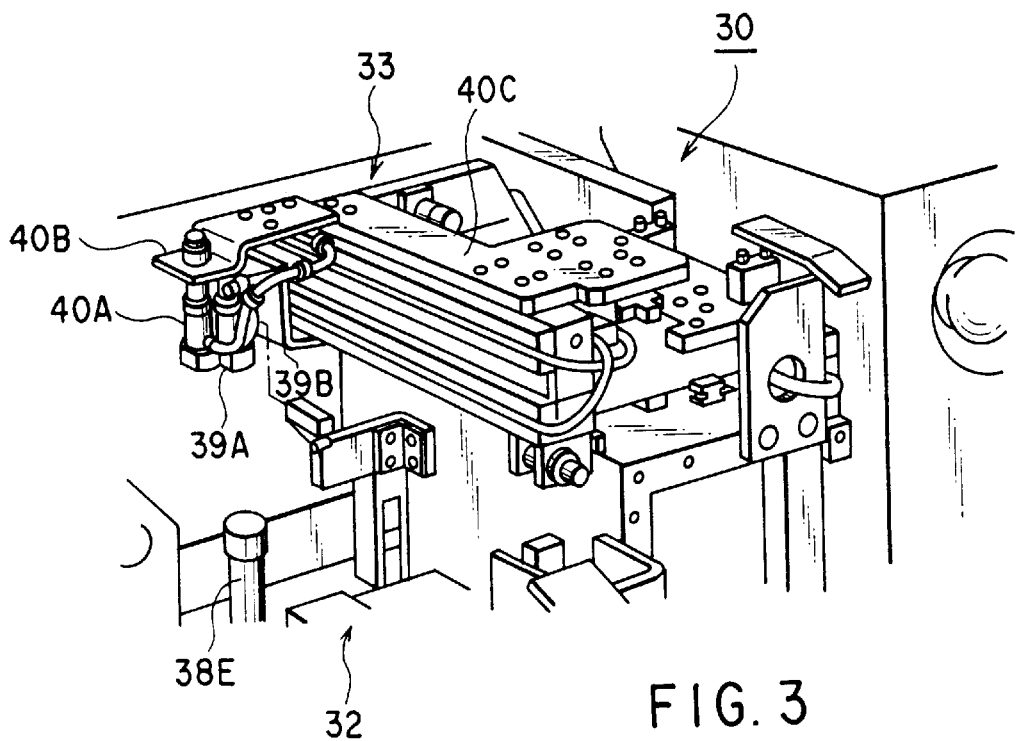
FIG. 3 is a perspective view of a transportation mechanism of the automatic changing apparatus.
Figure 8A:
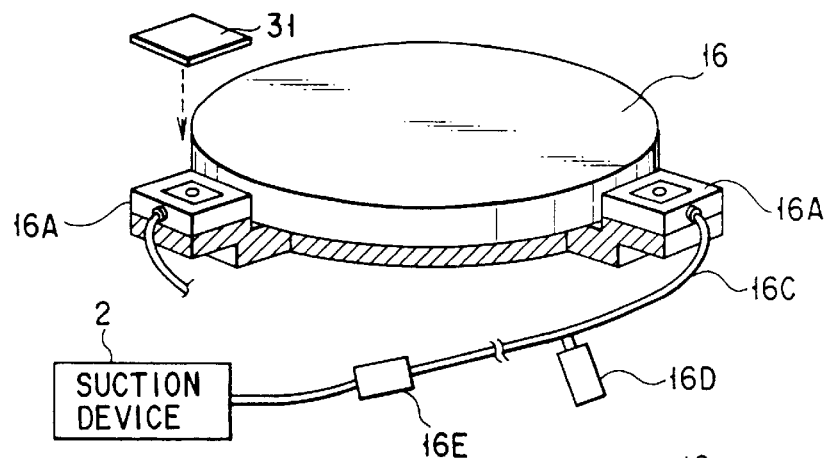
FIG. 8A is a perspective view of a main chuck.
Figure 8B:
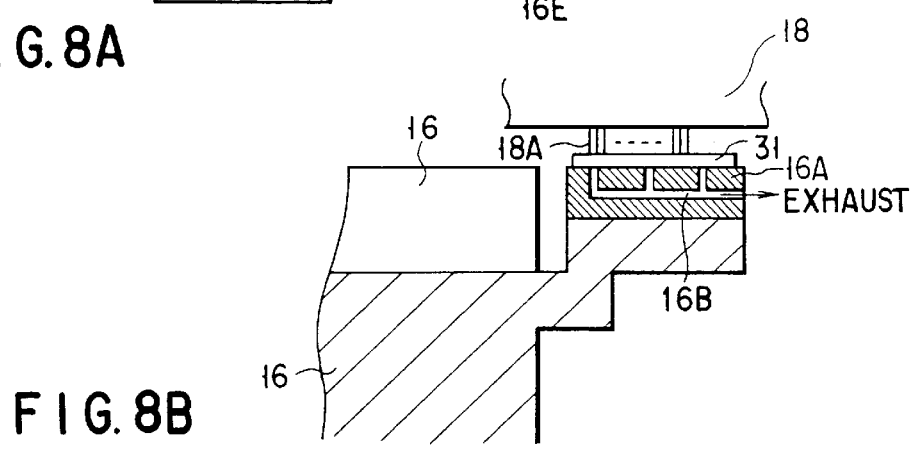
FIG. 8B is a sectional view of a polishing plate carrying region of the main chuck.

Provided on the front side of the prober section 13, as shown in FIGS. 1 to 3, is an automatic changing apparatus 30 for automatically changing the polishing plates 31 that serve to polish the tip of the probe 18A (see FIG. 8B). The apparatus 30 comprises a storage mechanism 32 for storing the polishing plates 31 and a transportation mechanism 33 for transporting the plates 31 between the storage mechanism 32 and the main chuck 16. As shown in detail in FIG. 4A, the storage mechanism 32 includes a rectangular first storage box 34, second storage box 35, elongate fixing mechanism 36 for fixing the boxes 34 and 35, and supporting mechanism 37 for supporting the mechanism 36. The first storage box 34 stores a plurality of unused polishing plates 31A (e.g., 50 in number) that are vertically stacked in layers, while the second storage box 35 stores used polishing plates 31B.

The first storage box 34 is formed of a tube having a substantially square cross section. A circular aperture 34A is formed in the bottom of the box 34. The unused polishing plates 31A in the first storage box 34 are pushed up by a pushup member 38E of a pushup mechanism 38 (mentioned later) that moves up and down through the aperture 34A. A flange portion 34B is formed on the lower end of the box 34. Two recesses 34C are formed in each side face of the flange portion 34B. In this arrangement, the first storage box 34 is fixed at a stroke to the fixing mechanism 36 with the aid of the flange portion 34B and the recesses 34C, as mentioned later. Notches 34D are formed in the upper end of the box 34. The second storage box 35 is a little larger than the first storage box 34, and has a tapered guide surface 35A on its upper end. The guide surface 35A serves to guide the used polishing plates 31B thereon into the second storage box 35.

The fixing mechanism 36 fixes the first and second storage boxes 34 and 35 in front and in rear along its longitudinal direction. More specifically, the mechanism 36 includes a carrying plate 36A, first, second, and third fixing members 36B, 36C and 36D, and operating handle 36E. The first and second storage boxes 34 and 35 are placed in front and in rear on the carrying plate 36A. The first and second fixing members 36B and 36C, which are located in front of the carrying plate 36A, engages the flange portion 34B of the first storage box 34, thereby fixedly holding the box 34 on the plate 36A. The third fixing member 36D fixes the second storage box 35 on the carrying plate 36A, in a position behind the first storage box 34. The handle 36E is used to load into or unload the carrying plate 36A from the supporting mechanism 37.

The first and second fixing members 36B and 36C have the shapes of opposite L's, individually, and in conjunction with the carrying plate 36A, hold the flange portion 34B of the first storage box 34. As shown in FIG. 4B, a pair of ball plungers 36F are embedded in the fixing members 36B and 36C, individually. The plungers 36F can engage their corresponding recesses 34C of the flange portion 34B. If the first storage box 34 is inserted sideways into the space between the fixing members 36B and 36C, therefore, the flange portion 34B is held between the carrying plate 36A and the fixing members 36B and 36C. Also, the respective distal ends of the ball plungers 36F are fitted into their corresponding recesses 34C, and the first storage box 34 is fixed on the carrying plate 36A. An aperture 7 is formed in that portion of the carrying plate 36A which corresponds to the aperture 34A of the first storage box 34. As mentioned later, moreover, the second fixing member 36C that adjoins the third fixing member 36D doubles as a fixing member for fixing the second storage box 35 in cooperation with the member 36D.

The third fixing member 36D is formed of three leaf springs, and is set up on the carrying plate 36A so that the leaf springs can individually hold three side faces of the second storage box 35. The top portion of each leaf spring forms a guide surface that is directed so as to be exposed to the outside. The second fixing member 36C has surfaces that correspond to the respective guide surfaces of the leaf springs, and in conjunction with the three leaf springs, holds the remaining side face of the second storage box 35. When the second storage box 35 is guided along the respective guide surfaces of the leaf springs to be fitted into the space between these springs from above, therefore, it is set in the third fixing member 36D and fixed on the carrying plate 36A by means of the elastic force of the springs.

The supporting mechanism 37 includes an L-shaped supporting base 37A composed of a horizontal plate portion and a vertical plate portion, a first supporting plate 37B projecting horizontally from the middle portion of the vertical plate portion of the supporting base 37A, and a first linear guide 37C located on the first supporting plate 37B and extending from the front side of the probe apparatus 10 to the rear side (along the direction in which the carrying plate 36A is loaded or unloaded). The supporting mechanism 37 further includes a second supporting plate 37D, which can reciprocate along the first linear guide 37C, and a second linear guide 37E located on the second supporting plate 37D and extending in the extending direction of the first linear guide 37C. An engaging member (not shown) on the lower surface of the carrying plate 36A engages the second linear guide 37E so that the carrying plate 36A can slide along the guide 37E. Thus, when the carrying plate 36A is pulled out with a hand on the operating handle 36E, the fixing mechanism 36 is drawn out from the first supporting plate 37B in two stages via the first and second linear guides 37C and 37E.

The storage mechanism 32 is provided with the pushup mechanism 38 for pushing up the unused polishing plates 31A in the first storage box 34. The pushup mechanism 38 includes a stepping motor 38A, a gear mechanism 38B, a rack 38C, a linear guide 38D integral with the rack 38C, and the pushup member 38E. The stepping motor 38A is located on the horizontal plate portion of the supporting base 37A, and is drivingly controlled by means of the controller 14. The gear mechanism 38B is rotated by means of the motor 38A. The rack 38C, which is in mesh with a pinion of the gear mechanism 38B, vertically penetrates an aperture in the horizontal plate portion of the supporting base 37A. The pushup member 38E is attached to the upper end of the rack 38C, and extends toward the aperture 34A of the first storage box 34 that is set in a storage position (indicated by two-dot chain line in FIG. 4A). When the stepping motor 38A is actuated, in this arrangement, the pushup member 38E moves up and down with the aid of the gear mechanism 38B and the rack 38C. Accordingly, the unused polishing plates 31A in the first storage box 34 are pushed up by the pushup member 38E that ascends through the aperture 34A of the box 34, and can come into contact with a vacuum pad 39A of the transportation mechanism 33, which will be mentioned later. The revolutions of the stepping motor 38A is detected by means of an encoder 38F (see FIG. 7), and a central processing unit of the controller 14 calculates the distance of lift of the polishing plates 31A on the basis of the resulting detection signal. The linear guide 38D, which is integral with the rack 38C, moves up and down along an engaging member 38G set up on the horizontal plate portion of the supporting base 37A.

Figure 5:
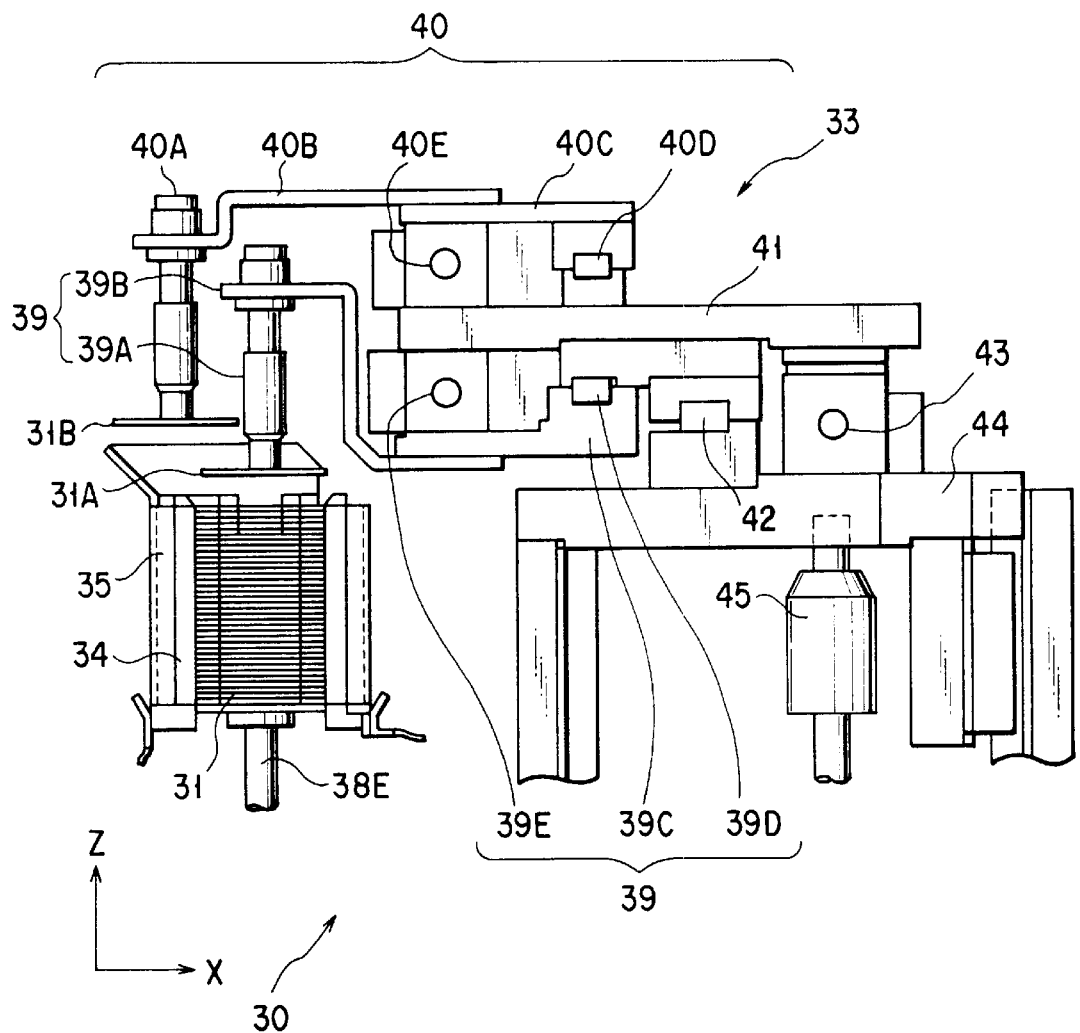
FIG. 5 is a front view of the transportation mechanism of the automatic changing apparatus.

As shown in detail in FIG. 5, the transportation mechanism 33 includes a first transportation mechanism 39 for loading, a second transportation mechanism 40 for unloading, a moving body 41 carrying the mechanisms 39 and 40, and an air cylinder 43 for reciprocating the moving body 41 along a linear guide 42. The first transportation mechanism 39 receives the unused polishing plates 31A one by one from the first storage box 34 and moves in the Y-direction, thereby transporting them to the main chuck 16. The second transportation mechanism 40 receives the used polishing plates 31B from the main chuck 16 and moves in the Y-direction, thereby transporting them to the second storage box 35. The first transportation mechanism 39 is located on the reverse side of the moving body 41, and the second transportation mechanism 40 on the obverse side. When the air cylinder 43 is actuated, in this arrangement, the moving body 41 causes the first and second transportation mechanisms 39 and 40 to move integrally for one half of the overall transportation distance, for example, in the Y-direction. Thereafter, the transportation mechanisms 39 and 40 are driven individually by means of drive mechanisms (mentioned later), and move for the remaining half of the overall transportation distance. Thus, the polishing plates 31 are transported in two stages. This is done in consideration of the limited space. If there is sufficient space, therefore, the polishing plates 31 may be transported in one stage.

As shown in FIG. 5, the transportation mechanism 33 is located on a supporting frame 44. In FIG. 5, numeral 45 denotes an air cylinder for moving the whole transportation mechanism 33 up and down. The cylinder 45 is used to evacuate the transportation mechanism 33 to a position where it does not interfere with the card transportation arm 9 when the probe card is transported by the arm 9.

The first and second transportation mechanisms 39 and 40 are constructed substantially in the same manner. The mechanisms 39 and 40 include vacuum pads 39A and 40A, respectively, for attracting the polishing plates 31 by vacuum suction. Pad portions of the vacuum pads 39A and 40A are formed of, for example, soft rubber such that they can softly touch the polishing plates 31 and undergo compressive deformation, thereby coming intimately into contact with the plates 31, when they attract the plates 31.

The distal end portion of an arm 39B, which extends in the X-direction, is connected to the upper end portion of the vacuum pad 39A. An engaging member 39C is connected to the proximal end portion of the arm 39B. The engaging member 39C is engaged by a linear guide 39D that extends in the Y-direction perpendicular to the arm 39B. In FIG. 5, numeral 39E denotes an air cylinder for reciprocating the arm 39B (and therefore, the vacuum pad 39A) along the linear guide 39D. The distal end portion of an arm 40B, which extends in the X-direction, is connected to the upper end portion of the vacuum pad 40A. An engaging member 40C is connected to the proximal end portion of the arm 40B. The engaging member 40C is engaged by a linear guide 40D that extends in the Y-direction perpendicular to the arm 40B. In FIG. 5, numeral 40E denotes an air cylinder for reciprocating the arm 40B (and therefore, the vacuum pad 40A) along the linear guide 40D.

Figure 6:
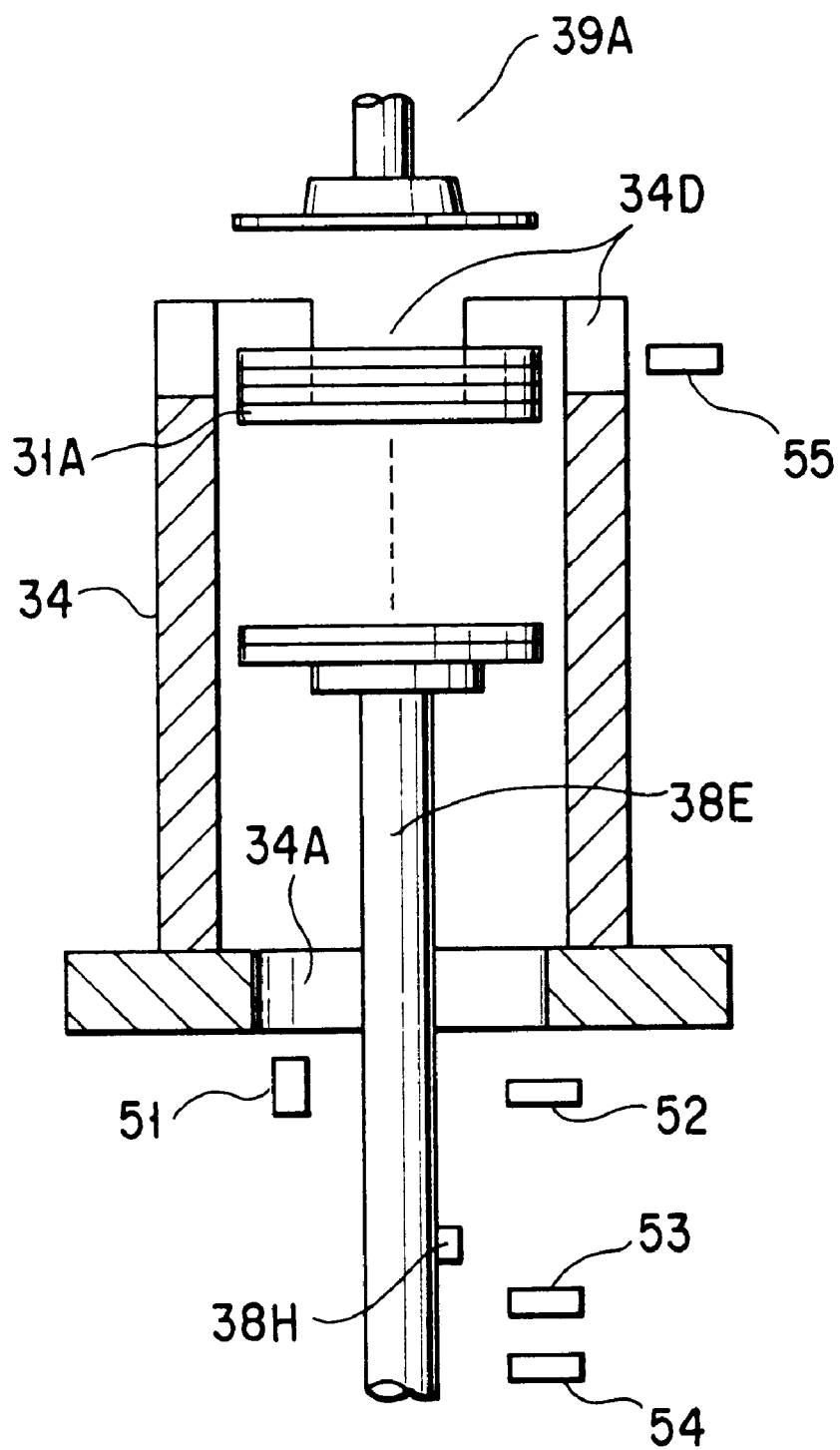
FIG. 6 is a view showing the first storage box set in a standby position and sensors surrounding the box.

FIG. 6 shows the first storage box 34 set in the storage position (indicated by two-dot chain line in FIG. 4A). As shown in FIG. 6, various sensors 51 to 55 are arranged in peripheral positions surrounding the storage position. A polishing plate presence sensor 51, a reflector-type sensor located under the first storage box 34, detects the presence of the polishing plates 31A in the box 34 through the aperture 34A thereof from below. In this case, the sensor 51 is situated in a position such that it does not interfere with the pushup member 38E getting into the first storage box 34 through the aperture 34A. If the polishing plates 31A are not detected by the sensor 51, a warning to this effect is given by means of a warning lamp or the like. Under the first storage box 34, a upper-limit sensor 52, origin sensor 53, and lower-limit sensor 54 are arranged vertically along the ascending/descending direction of the pushup member 38E. The origin sensor 53 detects a mark 38H on a rod of the pushup member 38E as the origin position for the member 38E. The upper- and lower-limit sensors 52 and 54 detect the upper- and lower-limit positions, respectively, for the pushup member 38E by the mark 38H. A polishing plate sensor 55 is located beside the notch 34D of the storage box 34. The sensor 55 detects the presence of the polishing plates 31A through the notch 34D, thereby determining whether or not the polishing plates 31A are raised to the level of the notch 34D of the first storage box 34 by the pushup member 38E. If the polishing plates 31A are detected by the sensor 55, the pushup member 38E is raised by the motor 38A, so that the plates 31 are pushed up for a certain distance.

Thereupon, the polishing plates 31A are set in a state such that they can be attracted to the vacuum pad 39A. In case the pushup mechanism 38 is stopped from any cause so that the pushup member 38E descends while the polishing plates 31A are being pushed up by the member 38E, a brake 38I (see FIG. 4A) is worked to prevent the polishing plates 31A from falling.

Figure 7:
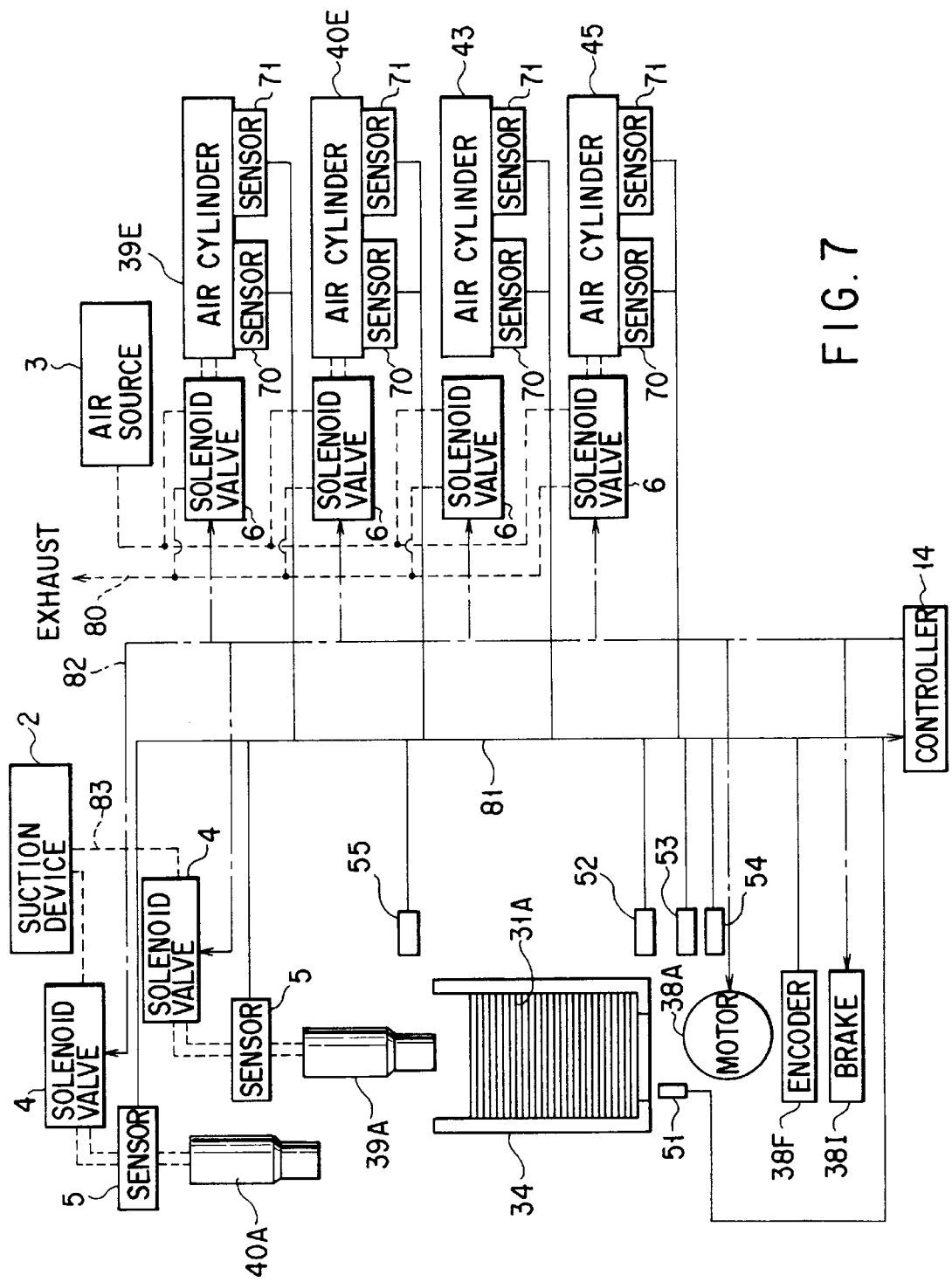
FIG. 7 is a circuit diagram showing a drive circuit of the automatic changing apparatus.

FIG. 7 schematically shows a drive circuit of the automatic changing apparatus 30. The air cylinders 39E, 40E, 43 and 45 in the transportation mechanism 33 are supplied with air from an air source 3 through an air channel 80. Also, the air from the cylinders 39E, 40E, 43 and 45 is discharged through the channel 80. Each air cylinder is provided with sensors 70 and 71 for detecting the extension and contraction of its cylinder rod. The air channel 80 is provided with solenoid valves 6 for controlling airflows. A sucking force from a suction device 2, such as a vacuum pump, acts on the vacuum pads 39A and 40A in the transportation mechanism 33 through suction channels 83. Each suction channel 83 is provided with a solenoid valve 4 for use as an on-off valve and a vacuum sensor 5 as a pressure sensor. The controller 14 receives detection signals from the sensors 5, 51 to 55, 70 and 71 and the encoder 38F through a detection signal line 81 as it controls the solenoid valves 4 and 6, motor 38A, and brake 38I through a driving signal line 82 in accordance with given programs.

As shown in detail in FIG. 8A, the main chuck 16 is provided with two polishing plate carrying regions 16A on which the polishing plates 31 are placed individually. As shown in FIG. 8B, a vacuum exhaust channel 16B is formed inside each region 16A. The channel 16B opens in a plurality of portions of the surface of the carrying region 16A. A vacuum exhaust tube 16C, which is connected to the suction device 2, is connected to an exhaust port of the exhaust channel 16B by means of a connector. The exhaust tube 16C is provided with a vacuum sensor 16D for use as a pressure sensor and a solenoid valve 16E as an on-off valve. According to the present embodiment, a pressure detected by means of the vacuum sensor 16D varies (increases) when the polishing plates 31 are transported onto the polishing plate carrying regions 16A. In response to a signal corresponding to the variation, therefore, the valve 16E is opened, whereupon the polishing plates 31 are attracted by vacuum suction.

According to the present embodiment, moreover, polishing plates 31 of the same type or different types may be arranged individually on the two polishing plate carrying regions 16A. In the case where the polishing plates 31 of the same type are arranged individually on the two regions 16A, different probes 18A may be polished by means of the two polishing plates 31, or one and the same probe 18A may be polished continuously by means of the two polishing plates 31. In the case where the polishing plates 31 of different types are arranged individually on the two regions 16A, on the other hand, they may be ones that are different in surface roughness, and are used for rough polishing and finish polishing, individually. In this case, the rough polishing can be directly followed by the finish polishing. When the polishing plates 31 of two different types are used, they should only be alternately stacked in layers in the first storage box 34, for example. Alternatively, a polishing plate 31 may be located on one of the two polishing plate carrying regions 16A with a gold plate for conduction check on the other. In this case, the probe 18A is brought into contact with the gold plate directly after it is polished by means of the polishing plate 31, so that the contact resistance of the probe 18A can be measured by means of the gold plate. In the case where the gold plate is used, moreover, the timing for polishing the probe 18A can be settled by measuring the contact resistance with the probe 18A in contact with the gold plate. The "gold plate" is a gilt plate, which is formed by depositing gold on the surface of a silicon wafer, for example.

Figure 8C:
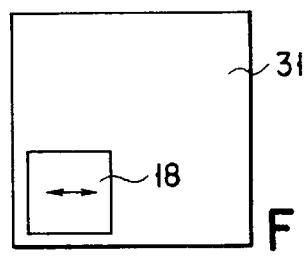
FIG. 8C is a view illustrating the direction of movement of the polishing plate relative to a probe.
Figure 8D:
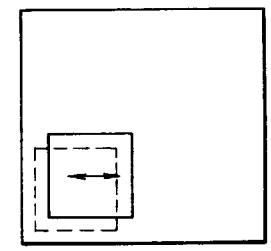
FIG. 8D is a view illustrating the direction of movement of the polishing plate relative to a probe.
Figure 8E:
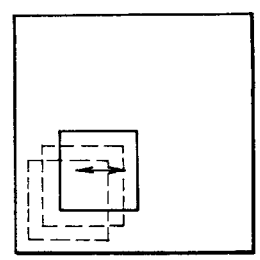
FIG. 8E is a view illustrating the direction of movement of the polishing plate relative to a probe.
Figure 8F:
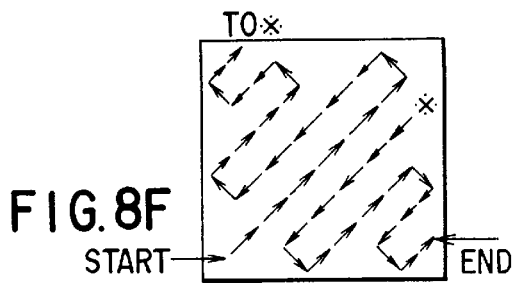
FIG. 8F is a view illustrating the direction of movement of the polishing plate relative to a probe.
Figure 9:
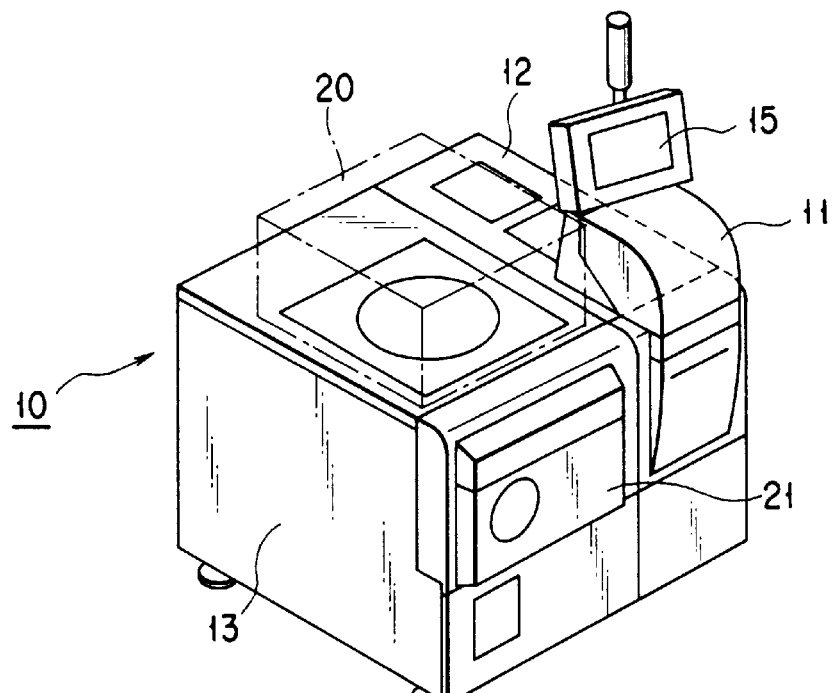
FIG. 9 is a perspective view of a conventional probe apparatus.
Figure 10:
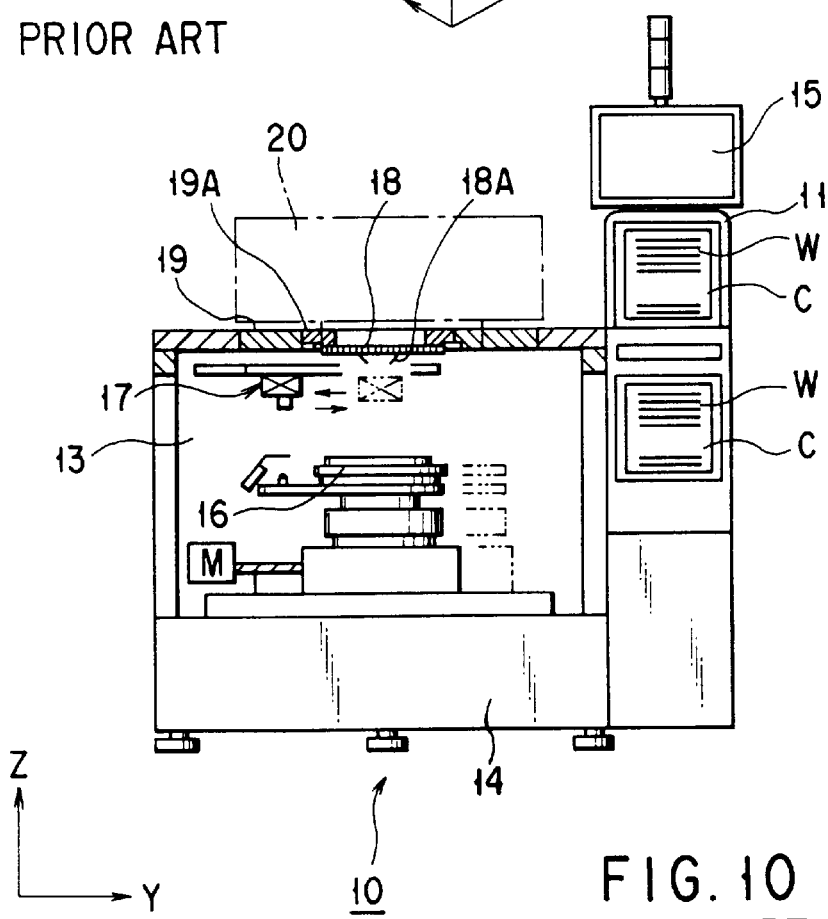
FIG. 10 is a diagram showing a prober section of the probe apparatus of FIG. 9.

The following is a description of the operation of the automatic changing apparatus 30 constructed in this manner and a method for polishing the probe. In storing the unused polishing plates 31A in the storage mechanism 32, the fixing mechanism 36 is drawn out from the supporting mechanism 37 with a hand on the operating handle 36E. Then, the first storage box 34, stored with 50 polishing plates 31A, is inserted into the space between the first and second fixing members 36B and 36C of the fixing mechanism 36. At this time, the ball plungers 36F are actuated so that the first storage box 34 is fixed on the carrying plate 36A. Further, the second storage box 35 can be fixed on the plate 36A by only being fitted into the third fixing member 36D. After the first and second storage boxes 34 and 35 are thus fixed on the carrying plate 36A, the fixing mechanism 36 is pushed and fitted into the supporting mechanism 37. In this state, the pushup member 38E of the pushup mechanism 38 is situated in the lowest position where the mark 38H is detected by the lower-limit sensor 54. When the inspection of a preset number of IC chips is completed, the main chuck 16 is automatically actuated in accordance with a given program for polishing. More specifically, the main chuck 16 is driven according to the given program, whereupon the polishing plate carrying regions 16A reach the position under the probe card 18. When the main chuck 16 continues to ascend and is overdriven, thereafter, the probe 18A and one of the polishing plates 31 are pressed against each other. In this state, the main chuck 16 is moved back and forth several times in, for example, horizontal direction, whereby the polishing plate 31 polishes the probe 18A. As a result, insulating material such as aluminum oxide is removed from the probe 18. The polishing plate 31 is displaced before every polishing, so that the same part will no be used repeatedly (see FIG. 8F). For instance, the plate 31 is moved back and forth several times in X-direction (each time, for 0.5 mm) in the first polishing step (see FIG. 8C). Then, the plate 31 is moved 1 mm in both X- and Y-directions from the position it has assumed during the first polishing step. The plate 31 is moved back and forth several times in X-direction (each time, for 0.5 mm) in the second polishing step (see FIG. 8D). Next, the plate 31 is moved 1 mm in both X- and Y-directions from the position it has taken during the second polishing step, and is moved back and forth several times in X-direction (each time, by 0.5 mm) in the third polishing step (see FIG. 8E). Further, the plate 31 is moved to different positions, and moved back and forth repeatedly at each of these positions, performing other steps of polishing the probe 18A.

The positions at which the plate 31 (or main chuck 16) is moved back and forth repeatedly to polish the probe 18A can be set by a computer program. The polishing plate 31 may be moved back and forth several times along a line inclined at a prescribed angle to the X-direction. Moreover, the polishing pattern (FIGS. 8C to 8F), polishing cycle, the number of polishing steps, and the like can be set by a computer program, in accordance with the type of the inspection which the probe 18A will perform.

When the surface of the polishing plate 31B is used up, accomplishing the polishing described above, the plate 31B is replaced with a new one 31A, under the control of a prescribed program. To replace the plate 31B with a new one 31A, the automatic changing apparatus 30 operates as will be described below.

At first, the air cylinders 40E and 43 are driven at the same time or one after the other with a time lag. To be more specific, the air cylinder 43 is driven for a predetermined stroke, moving the moving body 41 toward the main chuck 16 along the linear guide 42. Meanwhile, the air cylinder 40E is driven for a predetermined stroke (e.g., the last stroke), moving the arm 40B toward the main chuck 16 along the linear guide 40D provided on the moving body 41. When the vacuum pad 40A attached to the arm 40B is thereby moved to a position right above the main chuck 16 already set in waiting state, one of the sensors 71 (70) detects the state. The main chuck 16 is then moved upwards to a position where the vacuum pad 40A can draw the polishing plate 31B.

Thereafter, the solenoid valve 4 is switched on. The vacuum pad 40A is thereby driven, applying a suction force on the polishing plate 31B. Thus, the plate 31B is drawn to the vacuum pad 40A. The sensor 5 is thereby turned on, and the solenoid valve 16E is turned off. As a result, the suction force attracting the polishing plate 31B toward the polishing plate carrying region 16A decreases. The plate 31B is therefore transferred completely to the vacuum pad 40A. In this condition, the sensor 16D is turned off, whereby the main chuck 16 moves downwards, and the cylinder rods of the air cylinders 40E and 43 is driven in reverse direction and the vacuum pad 40A move back from the main chuck 16.

When the cylinder rods of the air cylinders 40E and 43 return to the initial positions, they are detected by the sensor 70, which generates a detection signal. The detection signal turns off the solenoid valve 4. The suction force no longer acts on the vacuum pad 40A of the second transportation mechanism 40. The vacuum pad 40A stops holding the used polishing plate 31B. Released from the pad 40A, the plate 31B is discarded into the second storage box 35.

Then, the polishing plate sensor 51 detects the polishing plate 31A in the first storage box 34 and generates a detection signal. This signal drives the stepping motor 38A of the pushup mechanism 38. The gear mechanism 38B and the lack 38C are driven, lifting the pushup member 38E. As the pushup member 38E moves upwards, the origin sensor 53 detects the mark 38H. At this time the origin position of the pushup member 38E is stored into the memory device incorporated in the controller 14. The pushup member 38E further moves upwards, passing through the opening 34A made in the bottom of the first storage box 34 and pushes up the polishing plate 31A.

The polishing plate sensor 55 detects the plate 31A thus pushed up, and generates a detection signal. The detection signal stops the stepping motor 38A, whereby the pushup member 38E stops for some time. Then, the pushup member 38E pushes up the polishing plate 31A for the distance represented by the data stored in the memory device of the controller 14. The plate 31A is thereby set at a position where it can be attracted to the vacuum pad 39A.

Thereafter, the solenoid valve 4 is driven, applying a suction force on the vacuum pad 39A. The polishing plate 31A is attracted to the vacuum pad 39A. When the suction force of the pad 39A applied to the plate 31A (i.e., the degree of vacuum of the pad 39A) reaches a predetermined value (as is detected by the sensor 5), the stepping motor 38A is driven in the reverse direction. The pushup member 38E is thereby lowered. When the lower-limit sensor 54 detects that the member 38E reaches the lowest possible position, it generates a detection signal. This signal stops the stepping motor 38A, whereby the pushup mechanism 38 is stopped. At the same time, the air cylinders 39E and 43 are driven, either simultaneously or one after the other with a time lag. More specifically, the air cylinder 43 is driven for a predetermined stroke, moving the moving body 41 toward the main chuck 16 along the linear guide 42. And the air cylinder 39E is driven for a predetermined stroke (e.g., the last stroke), moving the arm 39B toward the main chuck 16 along the linear guide 39D provided on the moving body 41. When the vacuum pad 39A attached to the arm 39B is thereby moved to a position right above the main chuck 16 already set in waiting state, one of the sensors 71 (70) detects the state. The main chuck 16 is then moved upwards to a position where the polishing plate carrying region 16A can draw the polishing plate 31A.

Then, the solenoid valve 16E operates, drawing the polishing plate 31A to the polishing plate carrying region 16A. At this time, the sensor 16D is switched on, turning the solenoid valve 4 off. Hence, the suction force of he vacuum pad 39A decreases. The polishing plate 31A is completely transferred onto the polishing plate carrying region 16A. Thereafter, the main chuck 16 is lowered and the air cylinders 39E and 43 are driven in the reverse direction, in accordance with the detection signal supplied from the sensor 16D. The vacuum pad 39A is thereby moved backward.

Even in the case where the polishing plate 31 is automatically changed by the aforementioned operation, it is not always attracted in a predetermined position on the polishing plate carrying region 16A. Accordingly, the alignment mechanism is actuated to detect a deviation of the polishing plate 31 from a reference position. More specifically, the current position of the polishing plate 31 is accurately detected, and the detected position is compared with the reference position in the controller 14 so that the deviation can be calculated, whereupon the position for the plate 31 t o start polishing the probe 18A is obtained. Thus, in polishing the probe 18A by means of the polishing plate 31, the probe 18A can be brought securely into contact with the a predetermined position on the plate 31.

A s described above, the probe apparatus 10 according to the present embodiment is provided with the automatic changing apparatus 30, which comprises the storage mechanism 32 for storing the unused and used polishing plates 31 and the transportation mechanism 33. The transportation mechanism 33 receives the unused polishing plates 31A one by one from the storage mechanism 32 and transports them to the polishing plate carrying regions 16A of the main chuck 16. Also, the mechanism 33 receives the used polishing plates 31B from the regions 16A and transports them to the storage mechanism 32. Even in the case where the polishing plates 31 are disposable ones, or ones of two different types depending on the probe 18A, therefore, the unused and used polishing plates 31 can be automatically changed with high efficiency in a short period of time by means of the transportation mechanism 33, thereby ensuring high-reliability inspection. Thus, the replacement operation is easy, and filings on the polishing plates 31 can be prevented from forming particles.

The storage mechanism 32 includes the first storage box 34 storing the unused polishing plates 31A, second storage box 35 storing the used polishing plates 31B, fixing mechanism 36 for fixing the first and second storage boxes 34 and 35, supporting mechanism 37 for supporting the fixing mechanism 36, and pushup mechanism 38 for pushing up the unused polishing plates 31A through the aperture 34A in the bottom of the first storage box 34. Accordingly, the unused and used polishing plates 31 can be stored in a regular manner, so that they can be replaced correctly with one another. Thus, the used polishing plates 31B can be securely discarded without the possibility of being reused, so that high-reliability inspection can be ensured.

The transportation mechanism 33 includes the first transportation mechanism 39 for loading, which transports the unused polishing plates 31A from the first storage box 34 to the polishing plate carrying regions 16A of the main chuck 16, and the second transportation mechanism 40 for unloading, which transports the used polishing plates 31B from the regions 16A to the second storage box 35. Further, the first and second transportation mechanisms 39 and 40 include the vacuum pads 39A and 40A for attracting the unused and used polishing plates 31, arms 39B and 40B for supporting the pads 39A and 40A, and air cylinders 39E and 40E for reciprocating the arms 39B and 40B along the linear guides 39D and 40D, respectively. Therefore, any used polishing plate can be reliably distinguished from any new polishing plate and can be replaced therewith. In the present embodiment, after the plate 31B which has been used is removed from the plate carrying region 16A by the first transportation mechanism 40, mechanism 40 may be located at a position where it does not interfere with the mechanism 39. The new polishing plate 31A may then be placed in the plate carrying region 16A by the mechanism 39. Finally, both transportation mechanisms 39 and 40 may be returned to the initial positions so that they may not interfere. In this case, the used polishing plate 31B can be replaced with the new one 31A with high efficiency, within a short time.

The probe 18A may be polished by means of polishing plates 31 of two types that are different in surface roughness and are arranged individually on the two polishing plate carrying regions 16A of the main chuck 16 by means of the automatic changing apparatus 30. In this case, the polishing plates 31 alternately stacked in layers in the first storage box 34 are successively taken out of the box 34 and transported to the two carrying regions 16A. Thereafter, the probe 18A is roughly polished by means of the rough-surface polishing plate 31, and is then finely polished by means of the fine-surface polishing plate 31. In changing the polishing plates 31 used up during this series of polishing operations, the used polishing plates 31B are replaced individually with the unused polishing plates 31A through the same operations as aforesaid. According to this polishing method, the tip of the probe 18A can be polished so as to be smoother, so that the extent of contact between the probe 18A and an electrode pad can be improved, thus ensuring high-accuracy inspection.

Alternatively, the probe 18A may be polished by means of the polishing plate 31 that is located on one of the two polishing plate carrying regions 16A with the gold plate (not shown) located on the other by means of the automatic changing apparatus 30. In this case, the probe 18A polished by means of the polishing plate 31 is brought into contact with the gold plate on the other carrying region 16A, whereupon the contact resistance of the polished probe 18A is measured. According to this method, the polished probe 18A can be checked for workmanship. Alternatively, the contact resistance of the polished probe 18A may be measured in a manner such that the probe 18A is brought into the gold plate before it is polished. In this case, the timing for polishing the probe 18A can be determined in advance by the value of the contact resistance, so that the inspection can be stabilized. These probe polishing methods may be carried out without using the automatic changing apparatus 30 described herein.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:

1. A probe apparatus comprising:
   a stage carrying an object of inspection thereon and rotatable and movable in the horizontal and vertical directions;
   a probe located over the stage and adapted to be brought into contact with the object of inspection on the stage in order to subject the object to electrical inspection;
   a polisher carrying section attached to the stage and capable of carrying thereon a polisher for polishing the probe;
   a storage mechanism for storing the polisher; and
   a transportation mechanism for transporting the polisher between the storage mechanism and the polisher carrying section.

2. A probe apparatus according to claim 1, wherein said stage moves itself to bring the polisher on the polisher carrying section into contact with the probe, thereby polishing the probe.

3. A probe apparatus according to claim 1, wherein said stage is provided with two polisher carrying sections.

4. A probe apparatus according to claim 1, wherein said storage mechanism includes a first storage section for storing a plurality of unused polishers, a second storage section for storing a plurality of used polishers, a fixing mechanism for fixing the first and second storage sections, and a supporting mechanism for supporting the fixing mechanism.

5. A probe apparatus according to claim 4, wherein said first storage section is composed of a box, and said storage mechanism includes a pushup mechanism for pushing up the polishers in the first storage section through an aperture formed in the bottom of the first storage section.

6. A probe apparatus according to claim 4, wherein said first storage section contains polishers of two types alternately stacked in layers.

7. A probe apparatus according to claim 4, wherein said transportation mechanism includes a first transportation mechanism for transporting the polishers from the first storage section to the polisher carrying section and a second transportation mechanism for transporting the polishers from the polisher carrying section to the second storage section, the first and second transportation mechanisms each including a holder for attracting each polisher by vacuum suction, an arm for supporting the holder, and a drive mechanism for reciprocating the arm along a given transportation path.

8. A method for polishing a probe, comprising the steps of:
   transporting a polisher from a polisher storage section by means of a transportation mechanism so that the polisher is placed on a polisher carrying section on a stage for carrying an object of inspection thereon;
   moving the stage, thereby bringing the polisher on the polisher carrying section into contact with a probe, located over the stage and adapted to be brought into contact with the object of inspection on the stage in order to subject the object to electrical inspection, and polishing the probe by means of the polisher; and
   transporting the used polisher on the polisher carrying section to the polisher storage section by means of the transportation mechanism and transporting an unused polisher from the polisher storage section by means of the transportation mechanism so that the unused polisher is placed on the polisher carrying section.

9. A method for polishing a probe, comprising the steps of:
   transporting two polishers of the same type from a polisher storage section by means of a transportation mechanism so that the polishers are placed individually on two polisher carrying sections on a stage for carrying an object of inspection thereon;
   moving the stage, thereby bringing the polisher on at least one of the polisher carrying sections into contact with a probe, located over the stage and adapted to be brought into contact with the object of inspection on the stage in order to subject the object to electrical inspection, and polishing the probe by means of the polisher; and
   transporting the used polisher on the at least one polisher carrying section to the polisher storage section by means of the transportation mechanism and transporting an unused polisher from the polisher storage section by means of the transportation mechanism so that the unused polisher is placed on the polisher carrying section.

10. A method for polishing a probe, comprising the steps of:
    transporting two polishers, different in surface roughness, from a polisher storage section by means of a transportation mechanism so that the polishers are placed individually on two polisher carrying sections on a stage for carrying an object of inspection thereon;
    moving the stage, thereby bringing the rough-surface polisher on one of the polisher carrying sections into contact with a probe, located over the stage and adapted to be brought into contact with the object of inspection on the stage in order to subject the object to electrical inspection, and polishing the probe by means of the rough-surface polisher;
    moving the stage after the polishing by means of the rough-surface polisher, thereby bringing the fine-surface polisher on the other polisher carrying section into contact with the probe, and polishing the probe by means of the fine-surface polisher; and
    transporting the used polishers on the two polisher carrying sections to the polisher storage section by means of the transportation mechanism and transporting unused polishers from the polisher storage section by means of the transportation mechanism so that the unused polishers are placed on the two polisher carrying sections, individually.

11. A method for polishing a probe, comprising the steps of:
    transporting a polisher from a polisher storage section and a gilt plate by means of a transportation mechanism so that the polisher and the gilt plate are placed individually on two polisher carrying sections on a stage for carrying an object of inspection thereon;
    moving the stage, thereby bringing the polisher on one of the polisher carrying sections into contact with a probe, located over the stage and adapted to be brought into contact with the object of inspection on the stage in order to subject the object to electrical inspection, and polishing the probe by means of the polisher;

moving the stage after the polishing by means of the polisher, thereby bringing the gilt plate on the other polisher carrying section into contact with the probe, and measuring the contact resistance of the polished probe by means of the gilt plate; and transporting the used polisher on the one polisher carrying section to the polisher storage section by means of the transportation mechanism and transporting an unused polisher from the polisher storage section by means of the transportation mechanism so that the unused polisher is placed on the one polisher carrying section.

12. A method for polishing a probe according to claim 11, wherein said gilt plate on the other polisher carrying section is brought into contact with the probe by moving the stage before the probe is polished by means of the polisher, so that the contact resistance of the probe can be measured by means of the gilt plate.

\* \* \* \* \*